US012677632B2

(12) United States Patent
Kinoshita et al.

(10) Patent No.: US 12,677,632 B2
(45) Date of Patent: Jul. 7, 2026

(54) METHOD OF CONTROLLING SUBSTRATE TRANSFER SYSTEM

(71) Applicant: TOKYO ELECTRON LIMITED, Tokyo (JP)

(72) Inventors: Kosuke Kinoshita, Yamanashi (JP); Takashi Sugimoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 375 days.

(21) Appl. No.: 18/478,767

(22) Filed: Sep. 29, 2023

(65) Prior Publication Data

US 2024/0128110 A1      Apr. 18, 2024

(30) Foreign Application Priority Data

Oct. 13, 2022     (JP) ................................. 2022-164950

(51) Int. Cl.
*H10P 72/30*          (2026.01)
*H10P 72/00*          (2026.01)

(52) U.S. Cl.
CPC ...... *H10P 72/3302* (2026.01); *H10P 72/0464* (2026.01); *H10P 72/0466* (2026.01); *H10P 72/0606* (2026.01); *H10P 72/3304* (2026.01)

(58) Field of Classification Search
CPC ................... H01L 21/67745; H01L 21/67754
See application file for complete search history.

(56) References Cited

U.S. PATENT DOCUMENTS

| | | | | |
|---|---|---|---|---|
| 6,486,444 B1 * | 11/2002 | Fairbairn | .......... | H01L 21/67196 |
| | | | | 118/724 |
| 11,081,377 B2 | 8/2021 | Goto et al. | | |
| 11,139,185 B2 * | 10/2021 | Hiroki | ............... | H01L 21/67196 |
| 2014/0064886 A1 * | 3/2014 | Toshima | .......... | H01L 21/67742 |
| | | | | 414/221 |
| 2020/0075377 A1 * | 3/2020 | Wakabayashi | .... | H01L 21/67745 |
| 2020/0118851 A1 | 4/2020 | Goto et al. | | |
| 2021/0143035 A1 * | 5/2021 | Sakaue | ............ | H01L 21/67781 |
| 2021/0305075 A1 * | 9/2021 | Jeon | .................. | H01L 21/67766 |
| 2021/0358780 A1 * | 11/2021 | Mori | ................. | H01L 21/67745 |
| 2021/0407837 A1 * | 12/2021 | Hudgens | .......... | H01L 21/67754 |

FOREIGN PATENT DOCUMENTS

| | | |
|---|---|---|
| JP | 2020-061472 A | 4/2020 |
| KR | 10-2020-0040682 A | 4/2020 |

* cited by examiner

*Primary Examiner* — Jonathan Snelting
(74) *Attorney, Agent, or Firm* — Fenwick & West LLP

(57) ABSTRACT

Provided is a method of controlling a substrate transfer system transferring substrates by controlling a first transfer device and a second transfer device comprising: a process of acquiring process module-specific substrate transfer positions for each of the plurality of process modules, wherein the process module-specific substrate transfer positions are substrate transfer positions of the mounting parts of the first transfer device for allowing the second transfer device to place substrates at centers of the stages, the second transfer device transferring substrates from the mounting parts of the load lock module to the stages of the process modules.

5 Claims, 9 Drawing Sheets

55

25A,25B

METHOD OF CONTROLLING SUBSTRATE TRANSFER SYSTEM

CROSS-REFERENCE TO RELATED APPLICATIONS

This application claims priority to Japanese Patent Application No. 2022-164950, filed on Oct. 13, 2022, the entire contents of which are incorporated herein by reference.

TECHNICAL FIELD

The present disclosure relates to a method of controlling a substrate transfer system.

BACKGROUND

Japanese Laid-open Patent Publication No. 2020-61472 discloses a substrate processing system including a transfer device that transfers a plurality of substrates from a load lock module to a process module.

SUMMARY

In one aspect, the present disclosure provides a method of controlling a substrate transfer system that transfers a plurality of substrates.

In accordance with an aspect of the present disclosure, there is provided a method of controlling a substrate transfer system, the substrate transfer system comprising: an atmospheric transfer module; a load lock module connected to the atmospheric transfer module and including a plurality of mounting parts on which substrates are able to be placed; a vacuum transfer module connected to the load lock module; a plurality of process modules connected to the vacuum transfer module and including a plurality of stages on which substrates are able to be placed; a first transfer device disposed in the atmospheric transfer module and configured to be able to transfer substrates one by one between the atmospheric transfer module and the load lock module; and a second transfer device disposed in the vacuum transfer module and configured to be able to simultaneously transfer a plurality of substrates between the vacuum transfer module and the load lock module and between the vacuum transfer module and the process modules, the method of controlling the substrate transfer system transferring substrates by controlling the first transfer device and the second transfer device comprising: a process of acquiring process module-specific substrate transfer positions for each of the plurality of process modules, wherein the process module-specific substrate transfer positions are substrate transfer positions of the mounting parts of the first transfer device for allowing the second transfer device to place substrates at centers of the stages, the second transfer device transferring substrates from the mounting parts of the load lock module to the stages of the process modules.

DETAILED DESCRIPTION

Figure 1:
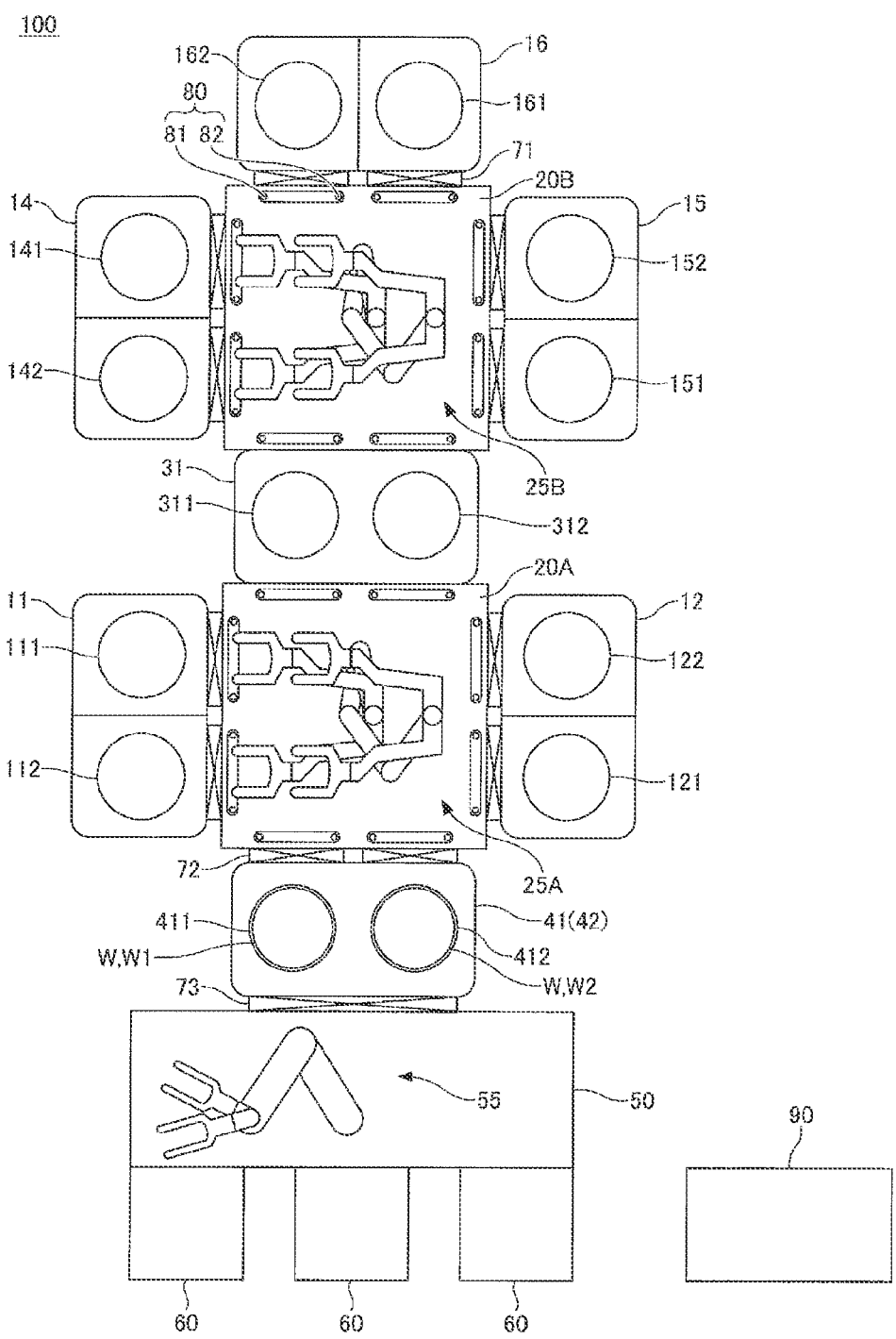
FIG. 1 is an example of a schematic diagram showing a configuration of a substrate transfer system 100 according to one embodiment.

Hereinafter, embodiments for carrying out the present disclosure will be described with reference to the drawings. In each drawing, the same component is denoted by the same reference numeral, and redundant description may be omitted.

<Substrate Transfer System 100>

An example of the overall configuration of a substrate transfer system 100 according to an embodiment will be described with reference to FIG. 1. FIG. 1 is an example of a schematic diagram showing the configuration of the substrate transfer system 100 according to an embodiment.

The substrate transfer system 100 shown in FIG. 1 is a cluster structure (multi-chamber type) system. The substrate transfer system 100 includes a plurality of process modules 11, 12, 14, 15, and 16, vacuum transfer modules 20A and 20B, a pass module 31, load lock modules 41 and 42, an atmospheric loader module 50, load ports 60, and a control device 90. In addition, FIG. 1 illustrates a state in which substrates W are placed on a mounting part 411 and a mounting part 412 of the load lock module 41, which will be described later. In the following description, a substrate placed on the mounting part 411 is referred to as a substrate W1, and a substrate mounted on the mounting part 412 is referred to as a substrate W2.

The process module 11 has stages 111 and 112 on which substrates W can be placed. Similarly, the process module 12 has stages 121 and 122 on which substrates W can be placed. The process module 14 has stages 141 and 142 on which substrates W can be placed. The process module 15 has stages 151 and 152 on which substrates W can be placed. The process module 16 has stages 161 and 162 on which substrates W can be placed. The insides of the process modules 11, 12, 14, 15, and 16 are decompressed to a predetermined vacuum atmosphere. Desired processes (for example, an etching process, a film formation process, a cleaning process, an asking process, and the like) are performed on substrates W placed on the stages inside the process module 11, 12, 14, 15 and 16. In addition, the process modules 11, 12, 14, 15 and 16 are controlled by the control device 90.

The stage 111 has, for example, a circular recess having an inner diameter slightly greater than the diameter of the substrate W. The substrate W is placed within the recess of the stage 111. The same applies to the stages 112, 121, 122, 141, 142, 151, 152, 161, and 162.

The vacuum transfer module 20A is connected to the process modules 11 and 12 through gate valves 71. The process modules 11 and 12 communicate with the vacuum transfer module 20A according to opening and closing of the gate valves 71. In addition, the vacuum transfer module 20A is connected to the load lock modules 41 and 42 through gate valves 72. The load lock modules 41 and 42 communicate with the vacuum transfer module 20A according to opening and closing of the gate valves 72.

The vacuum transfer module 20B is connected to the process modules 14, 15 and 16 through gate valves 71. The process modules 14, 15, and 16 communicate with the vacuum transfer module 20B according to opening and closing of the gate valves 71.

The insides of the vacuum transfer modules 20A and 20B are decompressed to a predetermined vacuum atmosphere. Further, the vacuum transfer module 20A has a vacuum transfer device (second transfer device) 25A that transfers substrates W. The vacuum transfer module 20B has a vacuum transfer device (second transfer device) 25B that transfers substrates W. The vacuum transfer devices 25A and 25B are configured to simultaneously transfer a plurality of (two in the configuration of FIG. 1) substrates W. Details of the vacuum transfer devices 25A and 25B will be described later with reference to FIG. 3.

The pass module 31 is provided between the vacuum transfer module 20A and the vacuum transfer module 20B. The pass module 31 is connected to the vacuum transfer module 20A and the vacuum transfer module 20B. The inside of the pass module 31 is decompressed to a predetermined vacuum atmosphere. The pass module 31 has mounting parts 311 and 312 on which substrates W can be mounted.

The vacuum transfer device 25A loads and unloads the substrate W between the process module 11 and the vacuum transfer module 20A according to opening and closing of the gate valves 71. Further, the vacuum transfer device 25A loads and unloads the substrate W between the process module 12 and the vacuum transfer module 20A according to opening and closing of the gate valves 71. In addition, the vacuum transfer device 25A loads and unloads the substrate W between the load lock module 41 and the vacuum transfer module 20A according to opening and closing of the gate valves 72. Further, the vacuum transfer device 25A loads and unloads the substrate W between the load lock module 42 and the vacuum transfer module 20A according to opening and closing of the gate valves 72. In addition, the vacuum transfer device 25A loads and unloads the substrate W between the pass module 31 and the vacuum transfer module 20A.

The vacuum transfer device 25B loads and unloads the substrate W between the process module 14 and the vacuum transfer module 20B according to opening and closing of the gate valves 71. Further, the vacuum transfer device 25B loads and unloads the substrate W between the process module 15 and the vacuum transfer module 20B according to opening and closing of the gate valves 71. In addition, the vacuum transfer device 25B loads and unloads the substrate W between the process module 16 and the vacuum transfer module 20B according to opening and closing of the gate valves 71. Further, the vacuum transfer device 25B loads and unloads the substrate W between the pass module 31 and the vacuum transfer module 20B.

The operations of the vacuum transfer devices 25A and 25B and opening and closing of the gate valves 71 and 72 are controlled by the control device 90.

The load lock modules 41 and 42 are provided between the vacuum transfer module 20A and the atmospheric loader module 50. That is, the load lock modules 41 and 42 are connected to the vacuum transfer module 20 through the gate valves 72. Further, the load lock modules 41 and 42 are connected to the atmospheric loader module 50 through door valves 73.

The load lock module 41 and the load lock module 42 are disposed vertically (in the vertical direction). In the example of FIG. 1, the load lock module 42 is disposed under the load lock module 41. However, the arrangement of the load lock modules 41 and 42 is not limited thereto. The load lock modules 41 and 42 may be disposed on the left and right (in the horizontal direction).

The load lock module 41 has the mounting parts 411 and 412 on which the substrate W can be mounted. Similarly, the load lock module 42 has stages (not shown) on which the substrate W can be placed. The load lock modules 41 and 42 are configured such that the inside thereof can be switched between an atmospheric atmosphere and a vacuum atmosphere. The load lock modules 41 and 42 communicate with the vacuum transfer module 20A having a vacuum atmosphere according to opening and closing of the gate valves 72. The load lock modules 41 and 42 communicate with the atmospheric loader module 50 according to opening and closing of the door valves 73. Switching between the vacuum atmosphere and the atmospheric atmosphere inside the load lock modules 41 and 42 is controlled by the control device 90.

The atmospheric loader module 50 has an atmospheric atmosphere thereinside, and for example, a down flow of clean air is formed therein. In addition, the atmospheric loader module 50 includes an atmospheric transfer device (first transfer device) 55 for transferring substrates W. The atmospheric transfer device 55 is configured to transfer substrates W one by one. Details of the atmospheric transfer device 55 will be described later with reference to FIG. 2.

The atmospheric transfer device 55 loads and unloads the substrate W between the load lock modules 41 and 42 and the atmospheric loader module 50 according to opening and closing of the door valves 73. Further, the atmospheric transfer device 55 loads and unloads the substrate W between the atmospheric loader module 50 and a carrier provided in the load port 60.

The operation of the atmospheric transfer device 55 and opening and closing of the door valves 73 are controlled by the control device 90.

The load port 60 is provided on the wall surface of the atmospheric loader module 50. A carrier containing substrates W or an empty carrier is set in the load port 60. As a carrier, for example, a front opening unified pod (FOUP) or the like may be used.

Further, in the vacuum transfer module 20A, position detectors 80 for detecting the positions of two substrates W transferred by the vacuum transfer device 25 are provided at positions adjacent to the process module 11. Each position detector 80 has, for example, two light blocking sensors 81 and 82 for one substrate transfer path. When two substrates W held by the vacuum transfer device 25A are transferred from the vacuum transfer module 20A to the process module 11, each light blocking sensor detects the edge of the substrate W. As a result, the position of the substrate W in the vacuum transfer device 25A (the relative position of the substrate W with respect to the vacuum transfer device 25A)

can be detected. In other words, each position detector 80 can detect the amount of deviation of the position of each substrate W that is actually held with respect to a reference holding position of the vacuum transfer device 25A. The position detectors 80 are connected to the control device 90 such that they can communicate and transmit detection information on the substrate W detected during transfer of the substrate W. Similarly, in the vacuum transfer module 20A, the position detectors 80 are provided at positions adjacent to the process module 12, the load lock modules 41 and 42, and the pass module 31. Further, in the vacuum transfer module 20B, the position detectors 80 are provided at positions adjacent to the process module 14, the process module 15, the process module 16, and the pass module 31. Detection signals detected by the position detectors 80 are transmitted to the control device 90.

The control device 90 includes a central processing unit (CPU), a read only memory (ROM), a random access memory (RAM), and a hard disk drive (HDD). The control device 90 may have other storage areas such as a solid state drive (SSD) in addition to the HDD. Recipes in which process procedures, process conditions, and transfer conditions are set are stored in storage areas such as the HDD and the RAM.

The CPU controls processing of substrates W in the process modules 11, 12, 14, 15, and 16 according to a recipe to control transfer of the substrates W. A program for executing processing of substrates W in each of the process modules 11, 12, 14, 15, and 16 and transfer of the substrates W may be stored in the HDD and the RAM. The program may be provided by being stored in a storage medium or may be provided from an external device through a network.

<Atmospheric Transfer Device 55>

Figure 2:
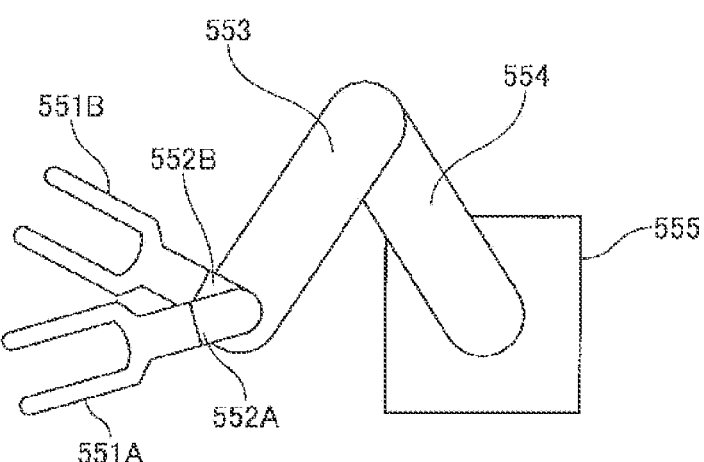
FIG. 2 is an example of a schematic diagram showing a configuration of an atmospheric transfer device.

Next, the atmospheric transfer device (first transfer device) 55 will be further described with reference to FIG. 2. FIG. 2 is an example of a schematic diagram showing the configuration of the atmospheric transfer device 55. The atmospheric transfer device 55 includes substrate holders 551A and 551B, base parts 552A and 552B, arms 553 and 554, and a base 555.

The substrate holder (also referred to as a pick or an end effector) 551A is configured to be able to hold the substrate W and is fixed to one end of the base part 552A. The other end of the base part 552A is rotatably connected to one end of the arm 553. The substrate holder (also referred to as a pick or an end effector) 551B is configured to be able to hold the substrate W and is fixed to one end of the base part 552B. The other end of the base part 552B is rotatably connected to one end of the arm 553. Further, the substrate holder 551A and the substrate holder 551B are disposed at different heights such that the substrate holder 551A holding the substrate W and the substrate holder 551B holding the substrate W are stacked vertically in two stages.

The arms 553 and 554 are, for example, SCARA-type articulated arms. The base parts 552A and 552B are rotatably connected to one end of the arm 553. The other end of the arm 553 is rotatably connected to one end of the arm 554. The other end of the arm 554 is rotatably connected to the base 555. The control device 90 can extend and retract the multi-joint arms by controlling the angle of each joint of the atmospheric transfer device 55, thereby controlling the positions and orientations of the substrate holders 551A and 551B.

The base 555 includes a lifting mechanism (not shown) that moves the arm 554 up and down. The control device 90 can move the substrate holders 551A and 551B up and down by controlling the lifting mechanism.

In addition, the atmospheric transfer device 55 includes a slide mechanism (not shown). The slide mechanism is configured to move the base 555 in parallel along the arrangement of the load ports 60 (refer to FIG. 1).

<Vacuum Transfer Devices 25A and 25B>

Figure 3:
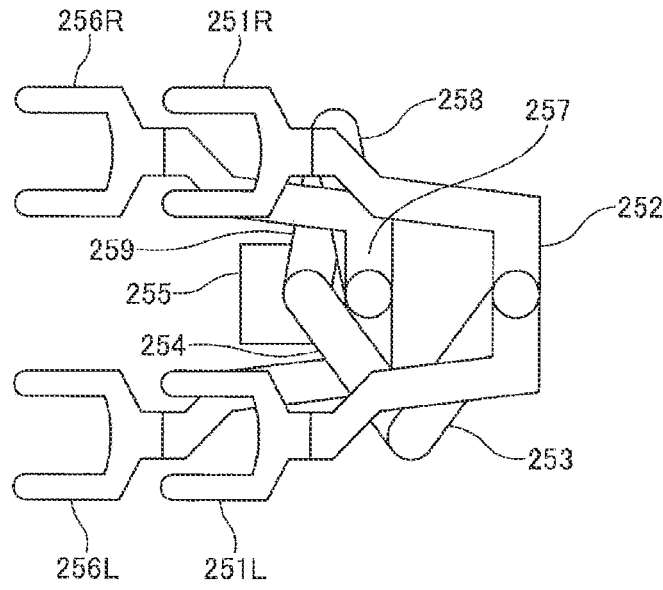
FIG. 3 is an example of a schematic diagram showing a configuration of a vacuum transfer device.

Next, the vacuum transfer devices (second transfer devices) 25A and 25B will be further described with reference to FIG. 3. FIG. 3 is an example of a schematic diagram showing the configuration of the vacuum transfer devices 25A and 25B. The vacuum transfer devices 25A and 25B include substrate holders 251R and 251L, a base part 252, arms 253 and 254, a base 255, substrate holders 256R and 256L, a base part 257, and arms 258 and 259.

The substrate holders (also called picks or end effectors) 251R and 251L are configured to be able to hold substrates W and are fixed to the branching base part 252. That is, the relative positional relationship between the substrate holder 251R and the substrate holder 251L cannot be adjusted. The base part 252 is rotatably connected to one end of the arm 253. The arms 253 and 254 are, for example, SCARA-type articulated arms. The base part 252 is rotatably connected to one end of the arm 253. The other end of the arm 253 is rotatably connected to one end of the arm 254. The other end of the arm 254 is rotatably connected to the base 255.

The substrate holders (also called picks or end effectors) 256R and 256L are configured to be able to hold substrates W and are fixed to the branching base part 257. That is, the relative positional relationship between the substrate holder 256R and the substrate holder 256L cannot be adjusted. The base part 257 is rotatably connected to one end of the arm 258. The arms 258 and 259 are, for example, SCARA-type articulated arms. The base part 257 is rotatably connected to one end of the arm 258. The other end of the arm 258 is rotatably connected to one end of the arm 250. The arm 258 is rotatably connected to one end of the arm 259. The other end of the arm 259 is rotatably connected to the base 255. Further, the substrate holders 251R and 251L and the substrate holders 256R and 256L are disposed at different heights such that the substrate holders 251R and 251L holding the substrates W and the substrate holders 256R and 256L holding the substrates W are stacked vertically in two stages.

The base 255 includes a lifting mechanism (not shown) that moves the arms 254 and 259 up and down. The control device 90 can move the substrate holders 251R and 251L and the substrate holders 256R and 256L up and down by controlling the lifting mechanism.

<Transfer Path>

Next, a transfer path of substrates W according to the substrate transfer system 100 will be described.

First, the case of transferring substrates W to the process module 11 will be described.

The control device 90 controls the atmospheric transfer device 55 to insert the substrate holder 551A into a carrier, hold the substrate W1 with the substrate holder 551A, and unload the substrate W1 from the carrier to the atmospheric loader module 50. Further, the control device 90 controls the atmospheric transfer device 55 to insert the substrate holder 551B into a carrier, hold the substrate W2 with the substrate holder 551B, and unload the substrate W2 from the carrier to the atmospheric loader module 50.

Next, the control device 90 opens the door valve 73 of the load lock module 41. Then, the control device 90 controls the atmospheric transfer device 55 to move the substrate holder 551A holding the substrate W1 to a preset instruction position (substrate transfer position) and place the substrate W1 on the mounting part 411. In addition, the control device 90 controls the atmospheric transfer device 55 to move the substrate holder 551B holding the substrate W2 to a preset instruction position (substrate transfer position) and place the substrate W2 on the mounting part 412. When the substrate holders 551A and 551B are retracted from the load lock module 41 to the atmospheric loader module 50, the control device 90 closes the door valve 73 and reduces the pressure in the load lock module 41 to a vacuum atmosphere.

Next, the control device 90 opens the gate valve 72 of the load lock module 41. The control device 90 controls the vacuum transfer device 25A to insert the substrate holders 251R and 251L into the load lock module 41, move the substrate holders 251R and 251L to preset substrate transfer positions in the load lock module 41, hold the substrate W1 with the substrate holder 251R, and hold the substrate W2 with the substrate holder 251L. Then, the control device 90 controls the vacuum transfer device 25A to unload the substrates W1 and W2 from the load lock module 41 to the vacuum transfer module 20A. When the substrate holders 251R and 251L are retracted from the load lock module 41 to the vacuum transfer module 20A, the control device 90 closes the gate valve 72.

Next, the control device 90 opens the gate valve 71 of the process module 11. The control device 90 controls the vacuum transfer device 25A to insert the substrate holder 251R holding the substrate W1 and the substrate holder 251L holding the substrate W2 into the process module 11, move the substrate holders 251R and 251L to preset substrate transfer positions in the process module 11, place the substrate W1 on the stage 111, and place the substrate W2 on the stage 112. When the substrate holders 251R and 251L are retracted from the process module 11 to the vacuum transfer module 20A, the control device 90 closes the gate valve 71. As a result, the substrate W1 placed on the mounting part 411 by the atmospheric transfer device 55 is placed on the stage 111 of the process module 11, and the substrate W2 placed on the mounting part 412 by the atmospheric transfer device 55 is placed on the stage 112 of the process module 11.

The substrate W is transferred to the process module 12 in the same manner as in the case of transferring the substrate W to the process module 11. As a result, the substrate W1 placed on the mounting part 411 by the atmospheric transfer device 55 is placed on the stage 121 of the process module 12, and the substrate W2 placed on the mounting part 412 by the atmospheric transfer device 55 is placed on the stage 122 of the process module 12.

Next, the case of transferring the substrate W to the process module 14 will be described. Processing until the substrates W1 and W2 are unloaded from the load lock module 41 to the vacuum transfer module 20A is the same as processing for transferring the substrate W to the process module 11, and thus redundant description will be omitted.

The control device 90 controls the vacuum transfer device 25A to insert the substrate holder 251R holding the substrate W1 and the substrate holder 251L holding the substrate W2 into the pass module 31, move the substrate holders 251R and 251L to preset substrate transfer positions in the pass module 31, place the substrate W1 on the mounting part 312, and place the substrate W2 on the mounting part 311. Then, the control device 90 controls the vacuum transfer device 25A to retract the substrate holders 251R and 251L from the pass module 31 to the vacuum transfer modules 20A.

Next, the control device 90 controls the vacuum transfer device 25B to insert the substrate holders 251R and 251L into the pass module 31, move the substrate holders 251R and 251L to preset substrate transfer positions in the pass module 31, hold the substrate W1 with the substrate holder 251L, and hold the substrate W2 with the substrate holder 251R. Then, the control device 90 controls the vacuum transfer device 25B to unload the substrates W1 and W2 from the pass module 31 to the vacuum transfer module 20B.

Next, the control device 90 opens the gate valve 71 of the process module 14. The control device 90 controls the vacuum transfer device 25B to insert the substrate holder 251L holding the substrate W1 and the substrate holder 251R holding the substrate W2 into the process module 14, move the substrate holders 251R and 251L to preset substrate transfer positions in the process module 14, place the substrate W1 on the stage 142, and place the substrate W2 on the stage 141. When the substrate holders 251R and 251L are retracted from the process module 14 to the vacuum transfer module 20B, the control device 90 closes the gate valve 71. As a result, the substrate W1 placed on the mounting part 411 by the atmospheric transfer device 55 is placed on the stage 142 of the process module 14, and the substrate W2 placed on the mounting part 412 by the atmospheric transfer device 55 is placed on the stage 141 of the process module 14.

The substrate W is transferred to the process module 15 in the same manner as in the case of transferring the substrate W to the process module 14. As a result, the substrate W1 placed on the mounting part 411 by the atmospheric transfer device 55 is placed on the stage 152 of the process module 15, and the substrate W2 placed on the mounting part 412 by the atmospheric transfer device 55 is placed on the stage 151 of the process module 15.

The substrate W is transferred to the process module 16 in the same manner as in the case of transferring the substrate W to the process module 14. As a result, the substrate W1 placed on the mounting part 411 by the atmospheric transfer device 55 is placed on the stage 162 of the process module 16, and the substrate W2 placed on the mounting part 412 by the atmospheric transfer device 55 is placed on the stage 161 of the process module 16.

Further, the control device 90 may control the vacuum transfer devices 25A and 25B, the atmospheric transfer device 55, the gate valves 71 and 72, and the door valves 73 in the same manner such that the substrates W1 and W2 on which substrate processing has been performed in the process modules 11, 12, 14, 15, and 16 can be accommodated in the carrier.

FIGS. 4A to 4E are examples of a schematic plan view showing substrates W (substrates W1 and W2) placed on the stages of the process modules 11, 12, 14, 15 and 16. The intersection of dashed-dotted lines indicates the center position of each stage.

Here, a case in which the atmospheric transfer device 55 has adjusted positions (instruction positions, substrate transfer positions) at which the substrates W1 and W2 are placed on the mounting parts 411 and 412 of the load lock module 41 such that the substrates W1 and W2 placed on the stages 111 and 112 of the process module 11 are mounted at the centers of the stages is illustrated.

Figures 4A, 4B, 4C, 4D, 4E:
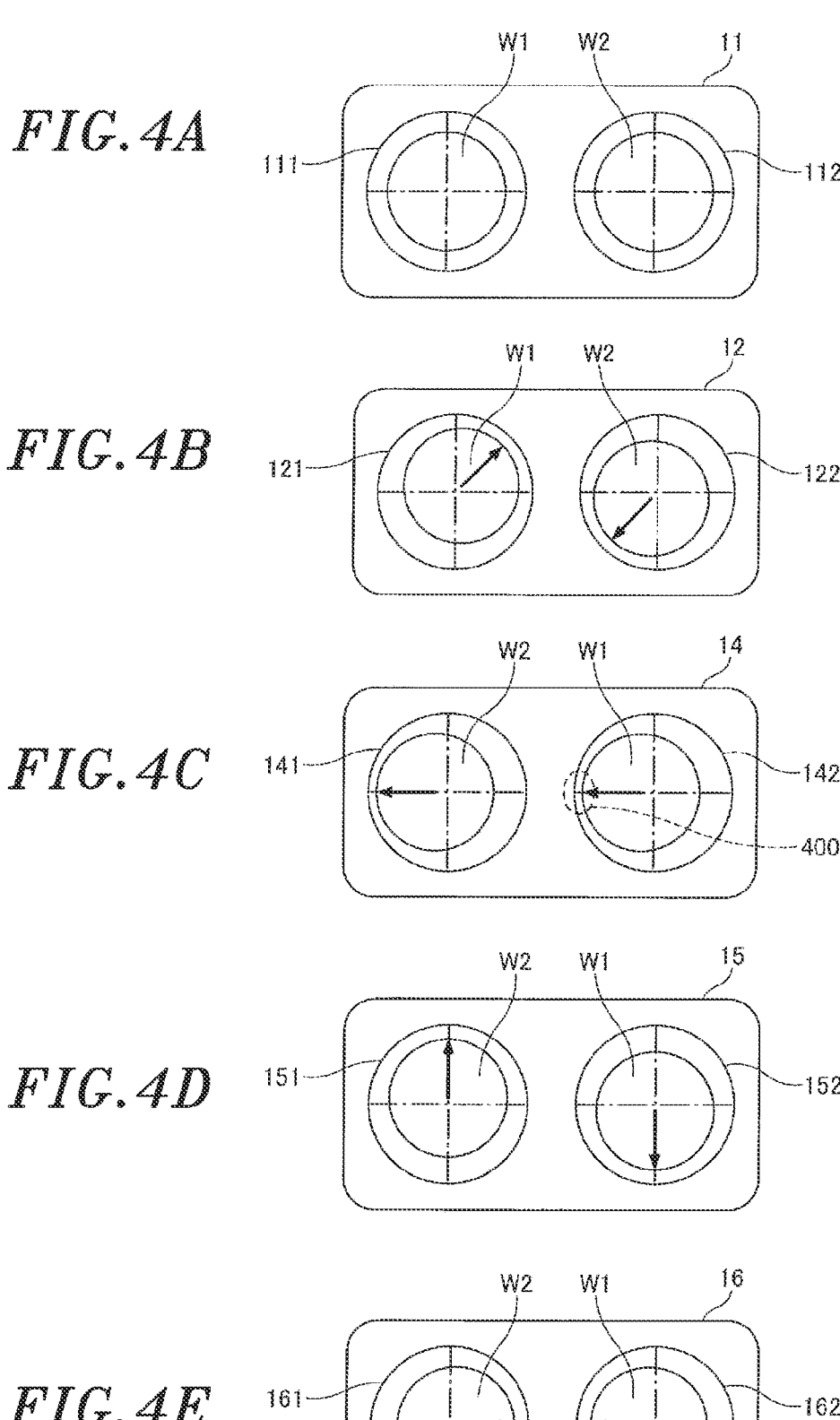
FIGS. 4A to 4E are examples of a schematic plan view showing a substrate placed on a stage in each process module.

In this case, the substrates W1 and W2 are placed at the centers of the stages 111 and 112 in the process module 11, as shown in FIG. 4A.

Here, a deviation occurs in the positional relationship between the two stages in each of the process modules 11, 12, 14, 15, and 16 due to an assembly error or the like. Accordingly, as shown in FIGS. 4B to 4E, the substrates W1 and W2 transferred to the process modules 12, 14, 15 and 16 are placed at positions shifted from the centers of the stages. In FIGS. 4B to 4E, a direction in which the substrate W deviates is indicated by an arrow.

As a result, in a configuration in which the substrate W is placed in the recess of a stage of a process module, for example, there is a risk that a clearance 400 between the substrate W and the side wall of the stage will decrease. Moreover, if the clearance 400 is small, there is a possibility that the substrate W cannot be placed in the recess of the stage.

Figure 5:
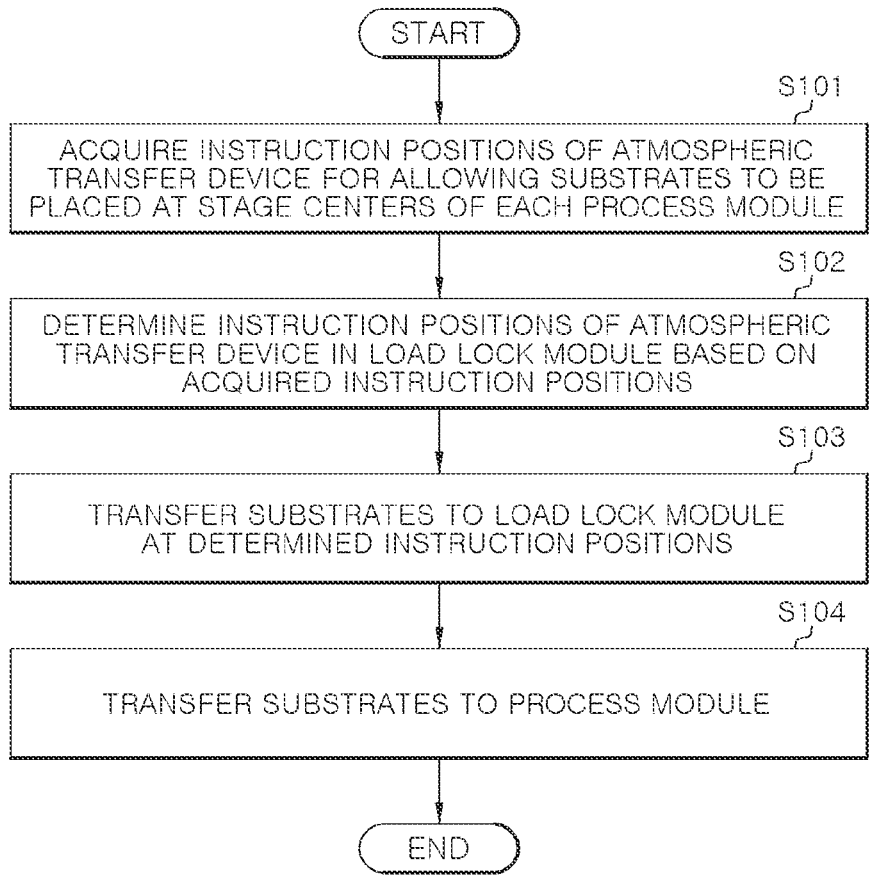
FIG. 5 is an example of a flowchart showing a method of controlling a substrate transfer system according to a first embodiment.

Method of Controlling Substrate Transfer System According to First Embodiment FIG. 5 is an example of a flowchart showing a method of controlling the substrate transfer system according to a first embodiment.

In step S101, the control device 90 acquires instruction positions (process module-specific substrate transfer positions) of the atmospheric transfer device 55 for allowing substrates W to be placed at the centers of the stages of each of the process modules 11, 12, 14, 15, and 16. That is, the control device 90 acquires process module-specific substrate transfer positions for each of the plurality of process modules 11, 12, 14, 15, and 16, and the process module-specific substrate transfer positions are substrate transfer positions of the mounting parts 411 and 412 of the atmospheric transfer device 55 for allowing the vacuum transfer devices 25A and 25B to place at the centers of the stage, and the vacuum transfer devices 25A and 25B transfer substrates from the mounting parts 411 and 412 of the load lock module 41 to the stages of each process module.

An example of a method of acquiring instruction positions of the atmospheric transfer device 55 for allowing the substrates W1 and W2 to be placed at the centers of the stages 111 and 112 of the process module 11 will be described.

First, the substrates W1 and W2 are placed at the centers of the stages 111 and 112 by an operator. The control device 90 controls the vacuum transfer device 25A to insert the substrate holders 251R and 251L into the process module 11, move the substrate holders 251R and 251L to preset substrate transfer positions in the process module 11, hold the substrate W1 with the substrate holder 251R, and hold the substrate W2 with the substrate holder 251L. Then, the control device 90 controls the vacuum transfer device 25A to unload the substrates W1 and W2 from the process module 11 to the vacuum transfer module 20A.

At this time, the edges of the substrates W1 and W2 are detected by the position detectors 80 provided on transfer paths from the process module 11 to the vacuum transfer module 20A. Based on detection signals of the position detectors 80, the control device 90 registers the position of the substrate W1 with respect to the substrate holder 251R and the position of the substrate W2 with respect to the substrate holder 251L as reference positions.

The control device 90 controls the atmospheric transfer device 55 to transfer the substrates W1 and W2 to the mounting parts 411 and 412 of the load lock module 41. Then, the control device 90 controls the vacuum transfer device 25A to insert the substrate holders 251R and 251L into the load lock module 41, move the substrate holders 251R and 251L to preset substrate transfer positions in the load lock module 41, hold the substrate S1 with the substrate holder 251R, and hold the substrate W2 with the substrate holder 251L. Subsequently, the control device 90 controls the vacuum transfer device 25A to unload the substrates W1 and W2 from the load lock module 41 to the vacuum transfer module 20A. Further, the control device 90 controls the vacuum transfer device 25A to move the substrate holder 251R holding the substrate W1 and the substrate holder 251L holding the substrate W2 to preset substrate transfer positions in the process module 11.

At this time, the edges of the substrates W1 and W2 are detected by the position detectors 80 provided on transfer paths from the vacuum transfer module 20A to the process module 11. The control device 90 detects the position of the substrate W1 with respect to the substrate holder 251R and the position of the substrate W2 with respect to the substrate holder 251L based on detection signals of the position detectors 80. Then, the amount of deviation between the detected position of the substrate W1 and the reference position of the substrate W1 is calculated. Further, the amount of deviation between the detected position of the substrate W2 and the reference position of the substrate W2 is calculated.

As a result, the control device 90 calculates and acquires an instruction position of the substrate holder 551A for allowing the substrate W1 to be placed at the center of the stage 111 by correcting an instruction position of the atmospheric transfer device 55 when the substrate holder 551A places the substrate W1 on the mounting part 411 with the amount of deviation between the detected position of the substrate W1 and the reference position of the substrate W1. Hereinafter, the instruction position of the substrate holder 551A for allowing the substrate W1 to be placed at the center of the stage 111 will be described as (Xa1, Ya1).

In addition, the control device 90 calculates and acquires an instruction position of the substrate holder 551B for allowing the substrate W2 to be placed at the center of the stage 112 by correcting an instruction position of the atmospheric transfer device 55 when the substrate holder 551B places the substrate W2 on the mounting part 412 with the amount of deviation between the detected position of the substrate W2 and the reference position of the substrate W2. Hereinafter, the instruction position of the substrate holder 551B for allowing the substrate W2 to be placed at the center of the stage 112 will be described as (Xb1, Yb1).

Subsequently, instruction positions of the atmospheric transfer device 55 for allowing substrates W to be placed at the centers of the stages are also acquired for the process modules 12, 14, 15, and 16.

As a result, five instruction positions of the atmospheric transfer device 55 when the substrate holder 551A places the substrate W1 on the mounting part 411 are obtained for each of the process modules 11, 12, 14, 15, and 16. Hereinafter, the instruction position of the substrate holder 551A for allowing the substrate W1 to be placed at the center of the stage 121 will be described as (Xa2, Ya2). The instruction position of the substrate holder 551A for allowing the substrate W1 to be placed at the center of the stage 142 will be described as (Xa4, Ya4). The instruction position of the substrate holder 551A for allowing the substrate W1 to be placed at the center of the stage 152 will be described as (Xa5, Ya5). The instruction position of the substrate holder 551A for allowing the substrate W1 to be placed at the center of the stage 162 will be described as (Xa6, Ya6).

Further, five instruction positions of the atmospheric transfer device 55 when the substrate holder 551B places the substrate W2 on the mounting part 412 are obtained for each of the process modules 11, 12, 14, 15, and 16. Hereinafter, the instruction position of the substrate holder 551B for allowing the substrate W2 to be placed at the center of the stage 122 will be described as (Xb2, Yb2). The instruction position of the substrate holder 551B for allowing the substrate W2 to be placed at the center of the stage 141 will be described as (Xb4, Yb4). The instruction position of the substrate holder 551B for allowing the substrate W2 to be placed at the center of the stage 151 will be described as (Xb5, Yb5). The instruction position of the substrate holder 551B for allowing the substrate W2 to be placed at the center of the stage 161 will be described as (Xb6, Yb6).

In step S102, the control device 90 determines instruction positions (substrate transfer positions) of the atmospheric transfer device 55 in the load lock module 41 based on the instruction positions for each process module acquired in step S101. That is, the control device 90 determines substrate transfer positions to which substrates W will be transferred from the atmospheric transfer device 55 to the mounting parts 411 and 412 based on the process module-specific substrate transfer positions for each of the process modules 11, 12, 14, 15, and 16.

Here, prior to description of instruction positions of the atmospheric transfer device 55 of the first embodiment, instruction positions of the atmospheric transfer device 55 according to reference examples will be described with reference to FIGS. 6A to 7B.

Figure 6B:
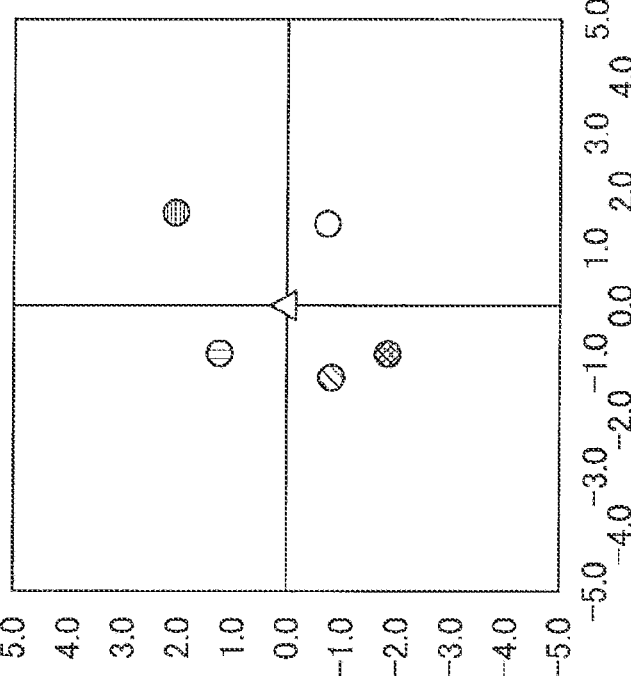
FIGS. 6A and 6B are examples of a diagram showing an instruction position of the atmospheric transfer device according to a first reference example.
Figure 6A:
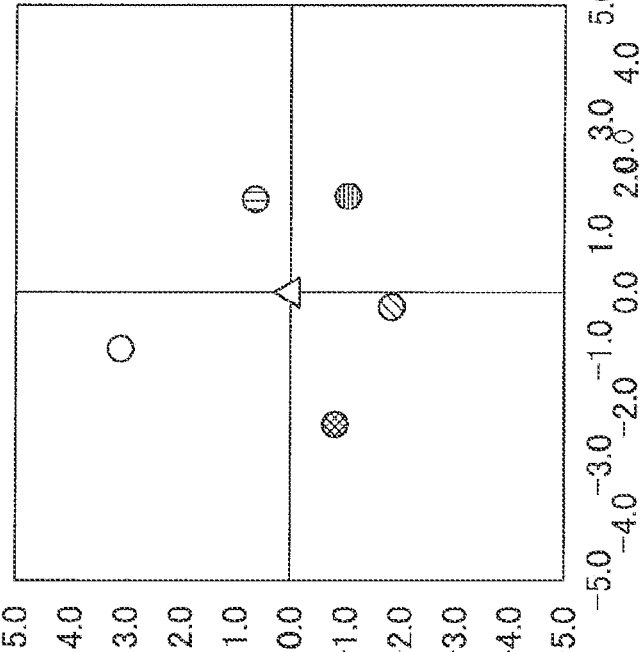

FIGS. 6A and 6B are examples of a diagram showing an instruction position of the atmospheric transfer device 55 according to the first reference example.

Figure 7B:
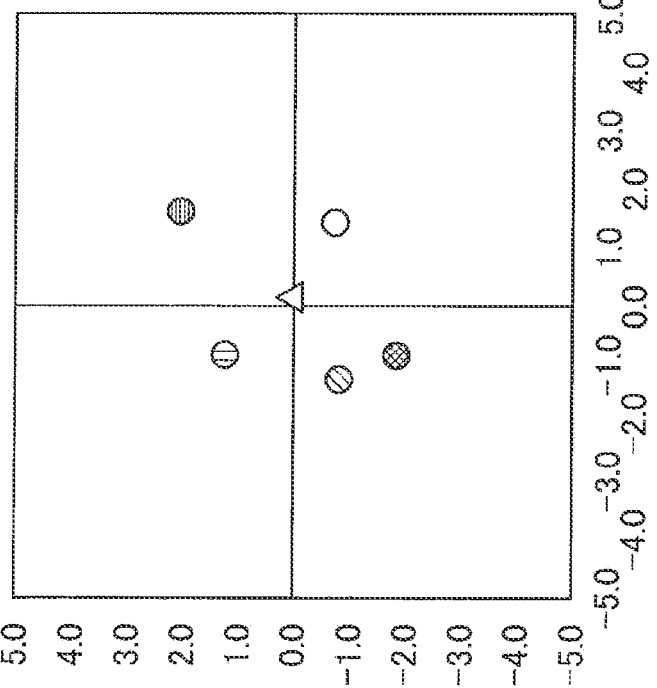
FIGS. 7A and 7B are examples of a diagram showing an instruction position of the atmospheric transfer device according to a second reference example.
Figure 7A:
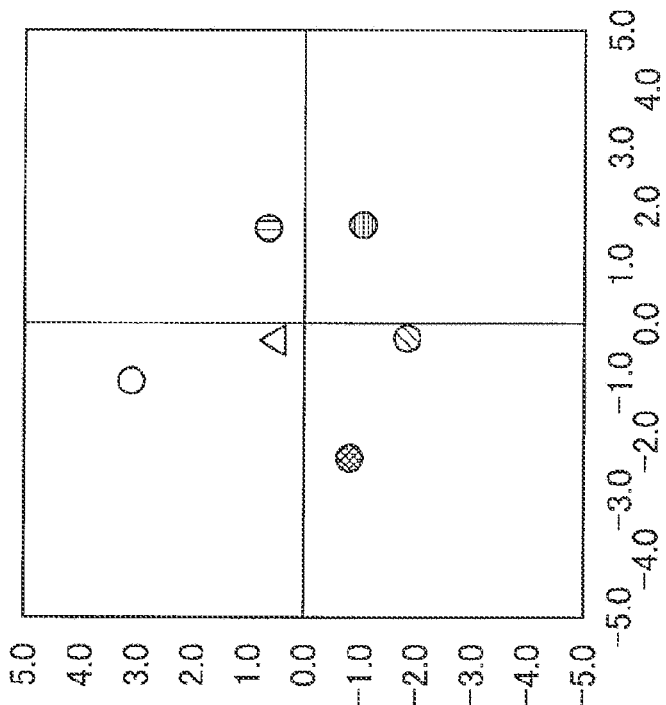
Figure 8B:
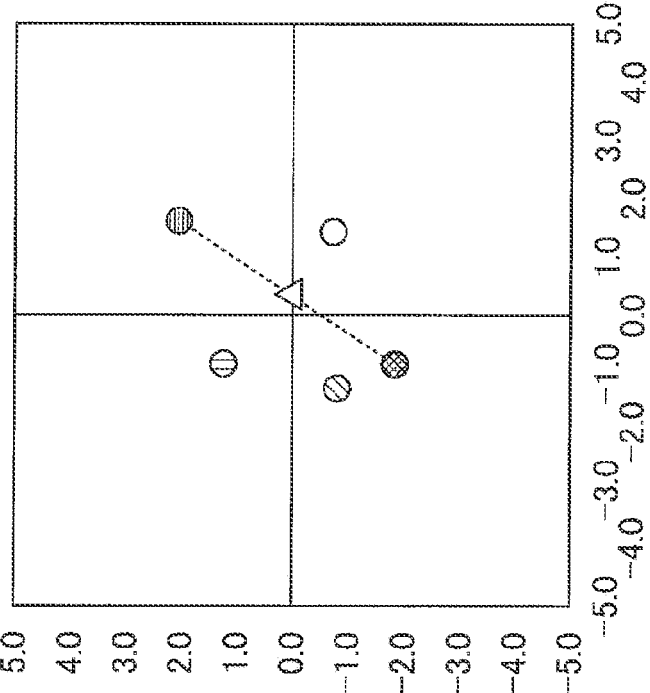
FIGS. 8A and 8B are examples of a diagram showing an instruction position of the atmospheric transfer device according to the first embodiment.
Figure 8A:
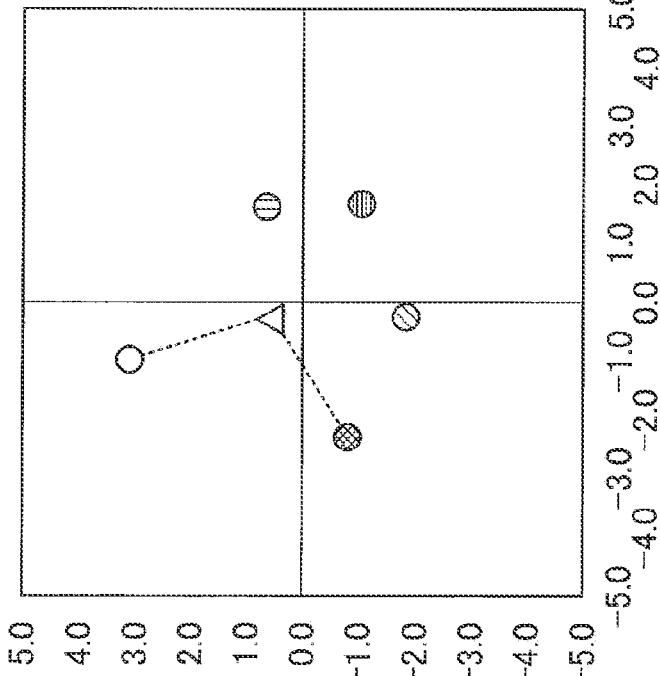

FIG. 6A and FIGS. 7A and 8A, which will be described later, show instruction positions when the substrate holder 551A places the substrate W1 on the mounting part 411. The horizontal axis indicates the width direction of the substrate holder 551A, and the vertical axis indicates the insertion/retraction direction of the substrate holder 551A. FIG. 6B and FIGS. 7B and 8B, which will be described later, show instruction positions when the substrate holder 551B places the substrate W2 on the mounting part 412. In FIGS. 6A to 8B, which will be described later, the horizontal axis indicates the width direction of the substrate holders 551A and 551B, and the vertical axis indicates the insertion/retraction direction of the substrate holders 551A and 551B. PM1 represents an example of an instruction position of the atmospheric transfer device 55 for allowing the substrate W to be placed at the center of a stage of the process module 11 acquired in step S101. PM2 represents an example of the instruction position of the atmospheric transfer device 55 for allowing the substrate W to be placed at the center of a stage of the process module 12 acquired in step S101. PM4 represents an example of the instruction position of the atmospheric transfer device 55 for allowing the substrate W to be placed at the center of a stage of the process module 14 acquired in step S101. PM5 represents an example of the instruction position of the atmospheric transfer device 55 for allowing the substrate W to be placed at the center of a stage of the process module 15 acquired in step S101. PM6 represents an example of the instruction position of the atmospheric transfer device 55 for allowing the substrate W to be placed at the center of a stage of the process module 16 acquired in step S101.

An instruction position of the atmospheric transfer device 55 in the load lock module 41 according to the first reference example is determined from the average value of the five points. The instruction position of the atmospheric transfer device 55 determined by this calculation method is indicated by a triangular marker.

FIGS. 7A and 7B are examples of a diagram showing an instruction position of the atmospheric transfer device 55 according to a second reference example.

An instruction position of the atmospheric transfer device 55 in the load lock module 41 according to the second reference example is determined from the intermediate value between the maximum value $X_{MAX}$ and the minimum value $X_{MIN}$ in the horizontal axis direction and intermediate value between the maximum value $Y_{MAX}$ and the minimum value $Y_{MIN}$ in the vertical axis direction. The instruction position of the atmospheric transfer device 55 determined by this calculation method is indicated by a triangular marker.

Next, an instruction position of the atmospheric transfer device 55 of the first embodiment will be described with reference to FIGS. 8A and 8B. FIGS. 8A and 8B are examples of a diagram showing an instruction position of the atmospheric transfer device 55 according to the first embodiment. Here, an instruction position of the atmospheric transfer device 55 for securing a clearance between the substrate W and the side wall of a stage is determined. Specifically, the control device 90 determines an instruction position of the atmospheric transfer device 55 having smallest maximum value of the distances between the plurality of process module-specific substrate transfer positions and the instruction position of the atmospheric transfer device 55.

First, the instruction position of the substrate holder 551A will be described. First, the instruction position is defined as P(xa, ya). The distance between (Xa1, Ya1) and P(xa, ya) is calculated and defined as a distance R1. The distance between (Xa2, Ya2) and P(xa, ya) is calculated and defined as a distance R2. The distance between (Xa4, Ya4) and P(xa, ya) is calculated and defined as a distance R4. The distance between (Xa5, Ya5) and P(xa, ya) is calculated and defined as a distance R5. The distance between (Xa6, Ya6) and P(xa, ya) is calculated and defined as a distance R6. A maximum value $R_{MAX}$ among the distances R1, R2, R4, R5, and R6 is defined as $R_{MAX}$. A maximum value $R_{MAX}$ is calculated for each of all combinations of instruction positions P(xa, ya). An instruction position P (xa, ya) having the smallest maximum value $R_{MAX}$ among all the combinations of instruction positions P (xa, ya) is determined as an instruction position for allowing a clearance to be secured.

Similarly, the instruction position of the substrate holder 551B is also determined. First, the instruction position is defined as P(xb, yb). The distance between (Xb1, Yb1) and P(xb, yb) is calculated and defined as a distance R1. The distance between (Xb2, Yb2) and P(xb, yb) is calculated and defined as a distance R2. The distance between (Xb4, Yb4) and P(xb, yb) is calculated and defined as a distance R4. The distance between (Xb5, Yb5) and P(xb, yb) is calculated and defined as a distance R5. The distance between (Xb6, Yb6) and P(xb, yb) is calculated and defined as a distance R6. A maximum value among the distances R1, R2, R4, R5, and R6 is defined as $R_{MAX}$. A maximum value $R_{MAX}$ is calculated for each of all combinations of instruction positions P(xb, yb). An instruction position P(xb, yb) having the smallest maximum value $R_{MAX}$ among all the combinations of instruction positions P(xb, yb) is determined as an instruction position for allowing a clearance to be secured.

As a result, the instruction position P(xa, ya) of the substrate holder 551A and the instruction position P(xb, yb) of the substrate holder 551B are determined. The instruction position of the atmospheric transfer device 55 determined by this calculation method is indicated by a triangular marker.

In a case in which the clearance when the substrates W1 and W2 are placed at the centers of the stages is set to 5 mm, when the atmospheric transfer device 55 transfers the substrates W1 and W2 to instruction positions determined by the calculation method of the first reference example shown in FIGS. 6A and 6B, the minimum clearance for the substrate W1 transferred to the process modules 11, 12, 14, 15 and 16 is 1.791 mm, and the minimum clearance for the substrate W2 is 2.380 mm.

Further, in a case in which the clearance when the substrates W1 and W2 are placed at the centers of the stages is set to 5 mm, when the atmospheric transfer device 55 transfers the substrates W1 and W2 to instruction positions determined by the calculation method of the second reference example shown in FIGS. 7A and 7B, the minimum clearance for the substrate W1 transferred to the process modules 11, 12, 14, 15, and 16 is 2.425 mm, and the minimum clearance for the substrate W2 is 2.584 mm.

Further, in a case in which the clearance when the substrates W1 and W2 are placed at the centers of the stages is set to 5 mm, when the atmospheric transfer device 55 transfers the substrates W1 and W2 to instruction positions determined by the calculation method of the first embodiment shown in FIGS. 8A and 8B, the minimum clearance for the substrate W1 transferred to the process modules 11, 12, 14, 15, and 16 is 2.465 mm, and the minimum clearance for the substrate W2 is 2.713 mm.

As shown in FIGS. 6A to 8B, according to the instruction positions determined by the calculation method of the first embodiment, it is possible to secure the clearances for the substrates W1 and W2.

Referring back to FIG. 5, in step S103, the control device 90 controls the atmospheric transfer device 55 to transfer the substrates W1 and W2 to the load lock modules 41 at the instruction positions determined in step S102. That is, the atmospheric transfer device 55 transfers the substrates W1 and W2 to the instruction positions (substrate transfer positions) determined in step S102. That is, regardless of a transfer destination of the substrates W, the atmospheric transfer device 55 transfers the substrates W1 and W2 at the set of instruction positions (substrate transfer positions) determined in step S102.

In step S104, the control device 90 controls the vacuum transfer devices 25A and 25B to transfer the substrates W1 and W2 to one of the process modules 11, 12, 14, 15 and 16.

Figure 9:
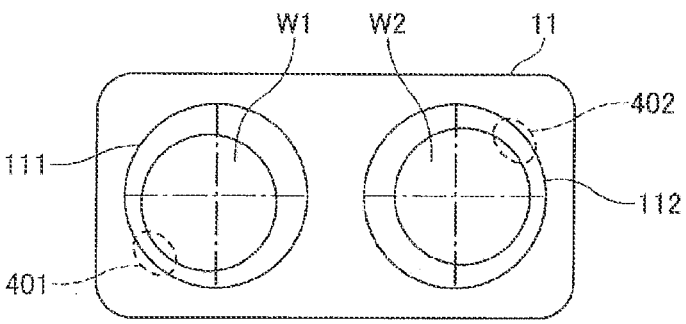
FIG. 9 is an example of a schematic plan view showing substrates placed on stages in a process module.

FIG. 9 is an example of a schematic plan view showing substrates placed on stages in a process module. Here, substrates W1 and W2 placed on the stages 111 and 112 of the process module 11 as an example of a process module is illustrated. As shown in FIG. 9, a clearance 401 between the substrate W1 and the side wall of the stage 111 can be secured, and a clearance 402 between the substrate W2 and the side wall of the stage 112 can be secured.

As a result, even if the center distances of the two stages are different in each process module, the substrates W can be placed in the recesses of the stages of each process module. Further, by securing a clearance, the uniformity of substrate processing can be improved.

Method of Controlling Substrate Transfer System According to Second Embodiment

Figure 10:
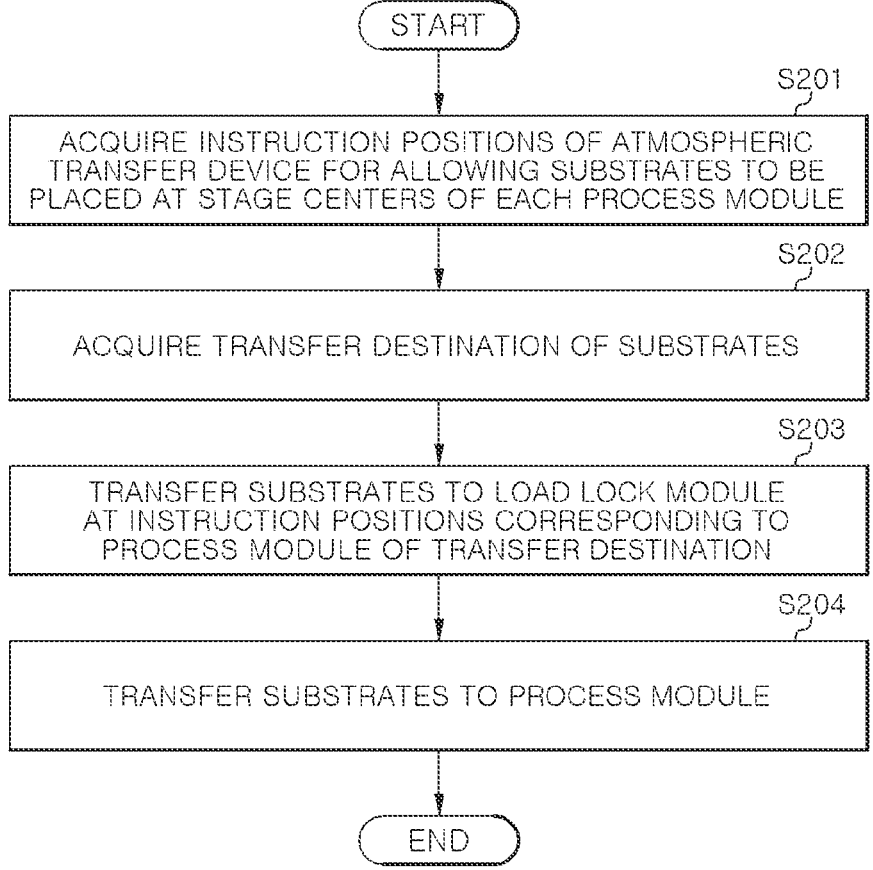
FIG. 10 is an example of a flowchart showing a method of controlling a substrate transfer system according to a second embodiment.

FIG. 10 is an example of a flowchart showing a method of controlling the substrate transfer system according to a second embodiment.

In step S201, the control device 90 acquires instruction positions (process module-specific substrate transfer positions) of the atmospheric transfer device 55 for allowing substrates W to be placed at the centers of the stages of each of the process modules 11, 12, 14, 15, and 16. That is, the control device 90 acquires process module-specific substrate transfer positions for each of the plurality of process modules 11, 12, 14, 15, and 16, and the process module-specific substrate transfer positions are substrate transfer positions of the mounting parts 411 and 412 of the atmospheric transfer device 55 for allowing the vacuum transfer devices 25A and 25B to place at the centers of the stage, and the vacuum transfer devices 25A and 25B transfer substrates from the mounting parts 411 and 412 of the load lock module 41 to the stages of each process module. The method of acquiring the substrate transfer positions is the same as that in step S101, and thus redundant description will be omitted.

In step S202, the control device 90 acquires a transfer destinations of the substrates W1 and W2 transferred to the load lock module 41 before the atmospheric transfer device 55 transfers the substrates W1 and W2 to the load lock module 41. That is, the control device 90 acquires any of the process modules 11, 12, 14, 15, and 16 to which the substrates W1 and W2 transferred to the load lock module 41 will be transferred.

In step S203, the control device 90 controls the atmospheric transfer device 55 to transfer the substrates W1 and W2 to the load lock module 41 at instruction positions (process module-specific substrate transfer positions) corresponding to the transfer destination process module acquired in step S202. That is, the atmospheric transfer device 55 selects the instruction positions corresponding to the transfer destination process module acquired in step S102 from the instruction positions for the respective process modules 11, 12, 14, 15, and 16 acquired in step S101, and transfers the substrates W1 and W2. That is, the atmospheric transfer device 55 transfers the substrates W to the process module-specific substrate transfer positions corresponding to the process module to which the vacuum transfer devices 25A and 25B transfer the substrates W among the plurality of process modules 11, 12, 14, 15, and 16. In other words, the control device 90 stores a plurality of instruction positions (process module-specific substrate transfer positions), and the atmospheric transfer device 55 transfers the substrates W1 and W2 at instruction positions (process module-specific substrate transfer positions) in accordance with the transfer destination.

In step S204, the control device 90 controls the vacuum transfer devices 25A and 25B to transfer the substrates W1 and W2 to the process module of the transfer destination.

As a result, even if the center distances of the two stages are different in each process module, substrates W can be placed at the centers of the stages. Therefore, the substrates W can be placed in the recesses of the stages of each process module. Further, by securing a clearance, the uniformity of substrate processing can be improved.

Although instruction positions of the atmospheric transfer device 55 at the time of placing substrates W on the stages of a process module have been described, the present disclosure is not limited thereto. When substrates W are transferred from a process module to the carrier, instruction positions may be used in a similar manner for processing when the atmospheric transfer device 55 unloads substrates W from the load lock modules 41 and 42.

Here, processing in a case in which the substrates W1 and W2 cannot be loaded due to an error or the like occurring in the processing module of the transfer destination while the vacuum transfer devices 25A and 25B transfer the substrates W1 and W2 will be described with reference to FIG. 11.

Figure 11:
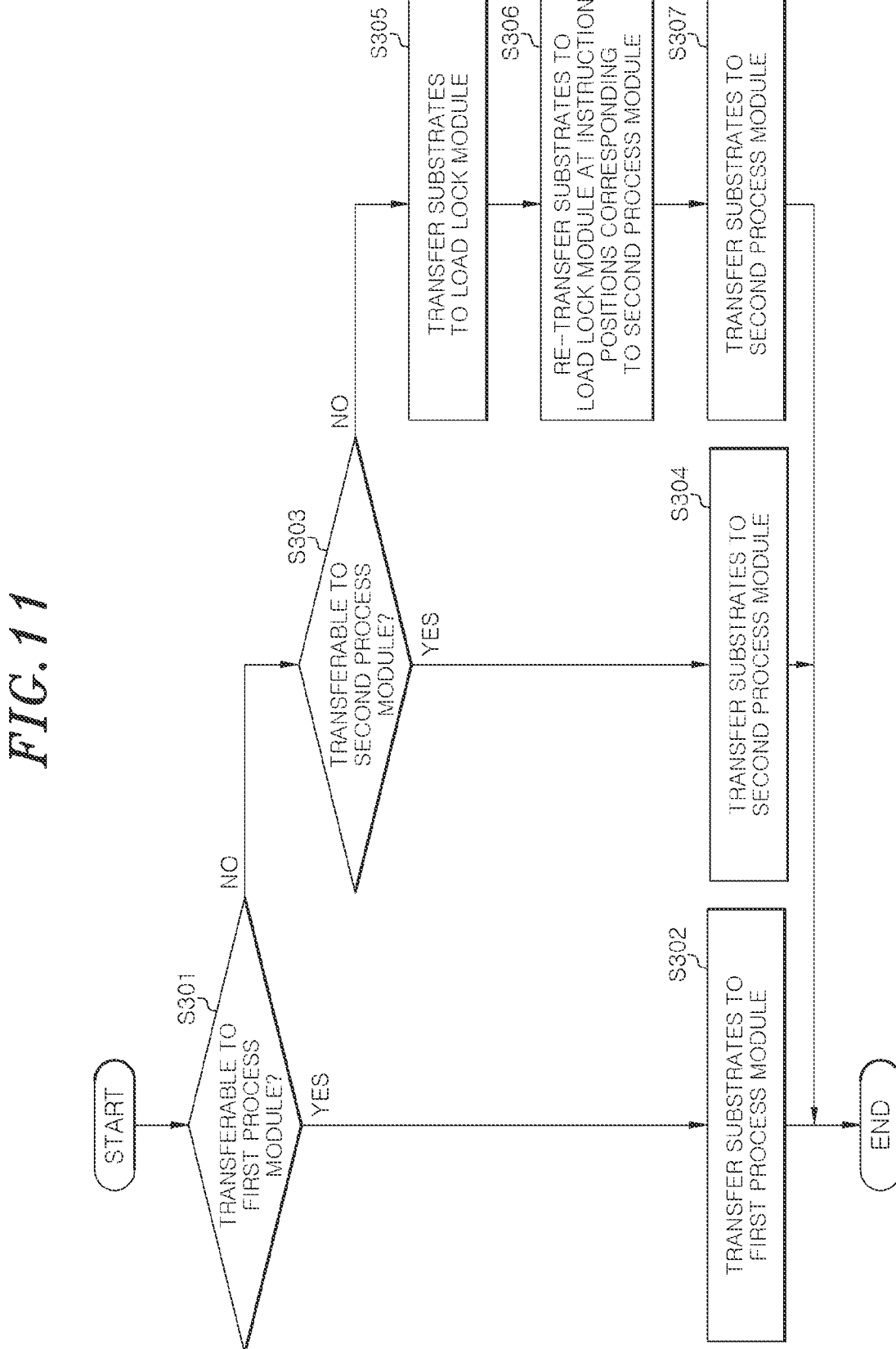
FIG. 11 is an example of a flowchart showing another method of controlling a substrate transfer system.

FIG. 11 is an example of a flowchart showing another method of controlling the substrate transfer system 100. Here, a process module of a transfer destination is described as a first transfer module.

In step S301, the control device 90 determines whether or not the substrates W1 and W2 can be transferred to the first transfer modules.

If the substrates W1 and W2 can be transferred to the first transfer module (YES in S301), processing of the control device 90 proceeds to step S302. In step S302, the control device 90 controls the vacuum transfer devices 25A and 25B to transfer the substrates W1 and W2 to the first transfer module.

If the substrates W1 and W2 cannot be transferred to the first transfer module (NO in S301), processing of the control device 90 proceeds to step S303. In step S303, the control device 90 determines whether or not the substrates W1 and W2 can be transferred to a second transfer module. Here, the control device 90 calculates in advance differences between the instruction positions of each of the process modules acquired in step S201. Transfer module candidates are determined in ascending order of instruction position differences with respect to the first transfer module. The control device 90 selects the second transfer module in a predetermined order of transfer module candidates. The control device 90 determines whether or not the substrates W1 and W2 can be transferred to the selected second transfer module. In the control device 90, a threshold value of the difference between instruction positions that allow transfer is registered in advance. When the difference between an instruction position of the first transfer module and an instruction position of the second transfer module does not exceed the threshold value, the control device 90 determines that the substrates W1 and W2 can be transferred to the second transfer module. On the other hand, when the difference between the instruction position of the first transfer module and the instruction position of the second transfer modules exceeds the threshold value, the control device 90 determines that the substrates W1 and W2 cannot be transferred to the second transfer module.

If the substrates W1 and W2 can be transferred to the second transfer module (YES in S303), processing of the control device 90 proceeds to step S304. In step S304, the control device 90 controls the vacuum transfer devices 25A and 25B to transfer the substrates W1 and W2 to the second transfer module.

If the substrates W1 and W2 cannot be transferred to the second transfer module (NO in S303), processing of the control device 90 proceeds to step S305. In step S305, the control device 90 controls the vacuum transfer devices 25A and 25B to transfer the substrates W1 and W2 to the load lock module 41. In step S306, the control device 90 controls the atmospheric transfer device 55 to unload the substrates W1 and W2 from the load lock module 41 to the atmospheric loader module 50 and transfer the substrates W1 and W2 to the load lock module 41 at the instruction positions corresponding to the second transfer module.

In step S307, the control device 90 controls the vacuum transfer devices 25A and 25B to transfer the substrates W1 and W2 to the second process module.

Accordingly, even when the substrates W cannot be transferred to the first process module, the substrates W can be transferred to the second process module.

Although the substrate transfer system 100 has been described above, the present disclosure is not limited to the above embodiments and the like, and various modifications and improvements are possible within the scope of the present disclosure described in the claims.

The invention claimed is:

1. A method of controlling a substrate transfer system, the substrate transfer system comprising:

16 an atmospheric transfer module;

a load lock module connected to the atmospheric transfer module and including a plurality of mounting parts on which substrates are able to be placed;

a vacuum transfer module connected to the load lock module;

a plurality of process modules connected to the vacuum transfer module and including a plurality of stages on which substrates are able to be placed;

a first transfer device disposed in the atmospheric transfer module and configured to be able to transfer substrates one by one between the atmospheric transfer module and the load lock module; and a second transfer device disposed in the vacuum transfer module and configured to be able to simultaneously transfer a plurality of substrates between the vacuum transfer module and the load lock module and between the vacuum transfer module and the process modules, the method of controlling the substrate transfer system transferring substrates by controlling the first transfer device and the second transfer device comprising:

a process of acquiring process module-specific substrate transfer positions for each of the plurality of process modules, wherein the process module-specific substrate transfer positions are substrate transfer positions of the mounting parts of the first transfer device for allowing the second transfer device to place substrates at centers of the stages, the second transfer device transferring substrates from the mounting parts of the load lock module to the stages of the process modules, and a process of determining an instruction position at which the first transfer device transfers substrates to each of the mounting parts based on the process module-specific substrate transfer positions for each of the plurality of process modules, wherein the instruction position has smallest maximum value of distances between a plurality of process module-specific substrate transfer positions and the instruction position.

2. The method of claim 1, comprising a process of transferring, by the first transfer device, substrates to the determined instruction position.

3. The method of claim 1, comprising a process of transferring, by the first transfer device, substrates to the process module-specific substrate transfer positions corresponding to a first process module to which the second transfer device transfers substrates, among the plurality of process modules.

4. The method of claim 3, further comprising, when it is determined that the substrates are not able to be transferred to the first process module upon determining whether or not the substrates are able to be transferred to the first process module, and it is determined that the substrates are able to be transferred to a second process module different from the first process module upon determining whether or not the substrates are able to be transferred to the second process module:

a process of transferring, by the second transfer device, substrates to the second process module.

5. The method of claim 3, further comprising, when it is determined that the substrates are not able to be transferred to the first process module upon determining whether or not the substrates are able to be transferred to the first process module, and it is determined that the substrates are not able to be transferred to a second process module different from the first process module upon determining whether or not the substrates are able to be transferred to the second process module:

a process of transferring, by the second transfer device, substrates to the mounting parts of the load lock module; and a process of transferring, by the first transfer device, substrates to process module-specific substrate transfer positions corresponding to the second process module.

* * * * *